United States Patent [19]

Kramer

[11] Patent Number: 4,868,869

[45] Date of Patent: Sep. 19, 1989

[54] DIGITAL SIGNAL PROCESSOR FOR PROVIDING TIMBRAL CHANGE IN ARBITRARY AUDIO SIGNALS

[75] Inventor: Gregory Kramer, Garrison, N.Y.

[73] Assignee: Clarity, Garrison, N.Y.

[21] Appl. No.: 141,631

[22] Filed: Jan. 7, 1988

[51] Int. Cl.⁴ .......... H03G 5/00

[52] U.S. Cl. .......... 381/61; 84/622

[58] Field of Search .......... 381/62, 63, 98, 61; 84/1.28, 477 R, 1.01, 1.19, 478; 364/725

[56] References Cited

U.S. PATENT DOCUMENTS

| | | | |
|---|---|---|---|
| 4,045,616 | 8/1977 | Sloane | 364/725 |
| 4,300,432 | 11/1981 | Deutsch | 84/1.01 |
| 4,464,784 | 8/1984 | Agnello | 381/61 |
| 4,569,268 | 2/1986 | Futamase et al. | 381/62 |
| 4,611,300 | 9/1986 | Taylor, Jr. et al. | 381/63 |
| 4,661,982 | 4/1987 | Kitazato et al. | 381/98 |
| 4,681,008 | 7/1987 | Morikawa et al. | 84/1.28 |
| 4,706,291 | 11/1987 | Kakubo et al. | 381/63 |
| 4,731,852 | 3/1988 | Liljeryd | 381/106 |
| 4,754,680 | 7/1988 | Morikawa et al. | 84/477 R |

OTHER PUBLICATIONS

"Turbosynth" (Software by Digidesign.)
Advertisement for Fairlight CMI in Computer Music Journal, vol. 3, No. 4, Dec. 1979.
Chamberlin, Musical Applications of Microprocessor, 1980, p. 344, FIG. 12-1.
Journal of Audio Engineering Society by Marc LeBrun & Daniel Arfib; V.27, #4 & V. 27 #10.
Computer Music Journal V.3, #3 Sep. 1979 James Beauchamp.
Journal of Audio Engineering Society by Richard Schaefer, '70 and '71 V. 18, #4 and V. 19, #7.

*Primary Examiner*—Forester W. Isen
*Attorney, Agent, or Firm*—Lilling & Greenspan

[57] ABSTRACT

An audio signal processor in which the harmonic content of the output signal varies with the amplitude of the input signal. The preferred embodiment includes an analog to digital converter, a sample and hold circuit, timing circuits, a RAM look-up table for performing non-linear transformation, a digital to analog converter and a post filter from which processed analog audio is output.

19 Claims, 13 Drawing Sheets

Processing Module
12

DIGITAL SIGNAL PROCESSOR FOR PROVIDING TIMBRAL CHANGE IN ARBITRARY AUDIO SIGNALS

BACKGROUND OF THE INVENTION

1. Field of the Invention

This invention generally relates to the field of electronic music and audio signal processing and, particularly, to a digital signal processor for providing timbral change in arbitrary audio signals as a function of the input amplitude of the signal being processed.

2. Description of the Prior Art

In the field of electronic music and audio recording it has long been an ambition to achieve two goals: Music that is synthesized or recorded with maximum realism and music that selectively includes special sounds and effects created by electronic and studio techniques. To achieve these goals, electronic musical instruments for imitating acoustic instruments (realism) and creating new sounds (effects) have proliferated. Signal processors have been developed to make these electronic instruments and recordings of any instruments sound more convincing and to extend the spectral vocabularies of these instruments and recordings.

While considerable headway has been made in various synthesis techniques, including analog synthesis using oscillators, filters, etc., and frequency modulation synthesis, the greatest realism has been attained by the technique of digitally recording small segments of sound for playback by a keyboard or other controller. This technique is called sampling and yields some very realistic sounds. However, this sampling technique has one very significant drawback: Unlike acoustic phenomena, the timbre of the sound is the same at all playback amplitudes. This results in uninteresting sounds that are less complex, controllable and expressive than the acoustic instruments they imitate. Similar problems occur to different degrees with other synthesis techniques.

To increase the realism of synthesized music, a number of signal processing techniques have been employed. Most of these processes, such as reverberation, were originally developed for the alteration of acoustic sounds during the recording process. When applied to synthesized waveforms, they helped increase the sonic complexity and made them more natural sounding. However, none of the existing devices are able to relate timbral variation to changes in loudness with any flexibility. This relationship is well understood to be critical to the accurate emulation of acoustic phenomena. This invention provides a means of relating these two parameters, the processed result being more realistic and interesting than the input.

A number of signal processing techniques have been developed for achieving greater variety, control and special effects in the sound generating and recording process. In addition to the realism mentioned above, these signal processors have sought to extend the spectrum of available sounds in interesting ways. Also, to a large extent many of the dynamic techniques of signal processing have been well investigated for special effects, including time/amplitude, time/frequency, and input/output amplitude. These processes include, reverberators, filters, compressors and so on. None of these devices have the property of relating the amplitude of the input to the timbre of the output in such a way as to add musically useful and controllable harmonics to the signal being processed.

There are two areas of prior art that have direct bearing upon the invention: the use of non-linear transformation in non- real-time mainframe computer synthesis and in real-time sine-wave based hardware synthesis. Non-linear transformation of audio for music synthesis via the use of look-up tables has been in common use in universities worldwide since the mid-1970's. The seminal work in this field was done by Marc LeBrun and Daniel Arfib and published in the Journal of the Audio Engineering Society, V.27, #4 & V.27 #10. The work described in these writings gives an overview of waveshaping and makes extensive use of Chebyshev polynomials. The work done in this area consists primarily of the distortion of sine waves in order to achieve new timbres in music synthesis. There was a particular focus on brass instrumental sounds, as evidenced by the work of James Beauchamp, (Computer Music Journal V.3,#3 Sept, 1979) and others.

Hardware synthesis exploiting the non-linearity of analog components has been employed in music to distort waveforms for many years. Research in this area was done by Richard Schaefer in 1970 and 1971 and published in the Journal of the Audio Engineering Society, V.18,#4 and V.19,#7. In this literature he discusses the equations employed to achieve predictable harmonic results when synthesizing sound. With a sine wave input and using Chebyshev polynomials to determine the non-linear components used on the output circuitry, different waveforms were synthesized for electronic organs. More recently, Ralph Deutsch has employed hardware lookup tables as a real-time variation of the earlier mainframe synthesis techniques (U.S. Pat. #4,300,432). The Deutsch patents differ from the work by LeBrun, Arfib et al only inasmuch as multiple sine waves rather than single sine waves are input into the look-up table to achieve the synthesis of the desired output.

The primary limitation of the above mentioned uses of non- linear transformation are their employment in synthesis environments that did not allow real-time arbitrary audio input. By embedding the look-up tables or non-linear analog components in the synthesis circuitry or software, distortion of audio signals from outside the synthesis system was rendered impossible.

The advantage of this invention lies in its capacity to accept and transform arbitrary audio input. This opens up the possibility of performing non-linear transformation upon acoustic signals. Also, original or modified audio signals produced by any synthesis technique can be processed by the waveshaper. It also enables the insertion of the waveshaping circuitry into various signal processor configurations. Thus, it can be included as part of the recording/mixdown process before or after other signal processors, such as compressors, reverberators and filters.

SUMMARY OF THE INVENTION

The present invention is a device for digitally processing audio signals in real time. In normal operation, the incoming audio signal is converted (via an analog to digital convertor) into digital samples at a fixed sample rate determined by a timing circuit. These samples are then used to sequentially address a look-up table stored in a dedicated memory array. Typically, these addresses will range from 0 to $2^N-1$, where N is the number of bits provided by the A-D convertor. The values stored at these addresses are sequentially read out of the look-up table, providing a series of output audio samples, corresponding to the incoming samples after modification by the table-lookup operation. These output samples will range from 0 to $2^M-1$ where M is the width in bits of the data entries in the lookup table. These output samples are then converted back into analog form via a D/A convertor. A post-filter is used to smooth out switching transients from the convertor. The resulting processed audio waveform can then be output to an amplifier and speaker.

A host computer interface, which facilitates entering and editing the values stored in the table via software, is also outlined. In this mode, the address to the table is selected from the address bus of the computer, rather than the output of the A/D convertor. The data from the array is attached to the computer's data bus, allowing the host to both read and write locations in the array.

In an alternative embodiment of the invention, the table-lookup operation is performed by a special-purpose digital signal processor (DSP) chip. Here, values output from the A/D convertor are read directly by the processor. A program running in the processor causes it to sequentially use the values read as addresses into a table stored somewhere in its program memory. The results of this look up operation are then output by the signal processor to a D/A convertor and post-filter in a manner identical to that outlined above. Table-modification software can be written to run directly on the DSP processor, or on a host computer that houses the entire DSP system, assuming the DSP program memory is accessible to the host computer.

BRIEF DESCRIPTION OF THE DRAWINGS

The invention will be better understood and appreciated from the detailed description that follows wherein reference will be made to the following drawings wherein.

DETAILED DESCRIPTION OF THE INVENTION

Figure 1:
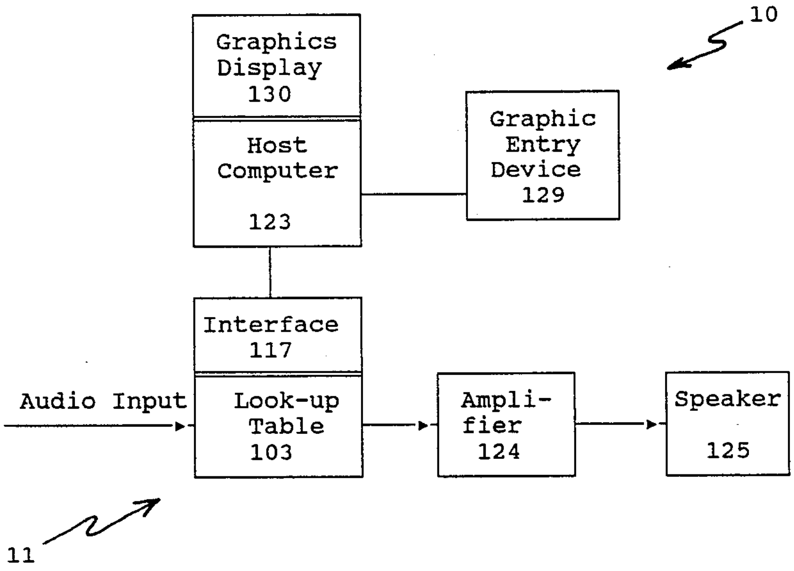
FIG. 1 is a diagram of a system incorporating the invention, including a host computer and attached graphic entry and display devices.

FIG. 1 shows a computer system 10 incorporating the invention. A processing module 11 in the form of a look-up table 103 is connected to a host computer 123 via the interface circuit 117 to facilitate the creation or modification of look-up tables. The graphic entry device 129 may be used to facilitate such table creation and modification. A simplified output section is shown to include an amplifier 124 and a speaker 125 for outputting the processed audio. Any well known hardware array of rows and columns may be used for the look-up table for storing a collection of data in a form suitable for ready reference and access. The specific look-up table configuration used is not critical for purposes of the present invention, although the access times should be compatible with the speeds of the system with which it operates. The host computer 123 preferably has a graphics display 130 for providing a visual representation of the transfer function resident in the look-up table 103, prior to or subsequent to modification by the graphics entry device 129.

Figure 2A:
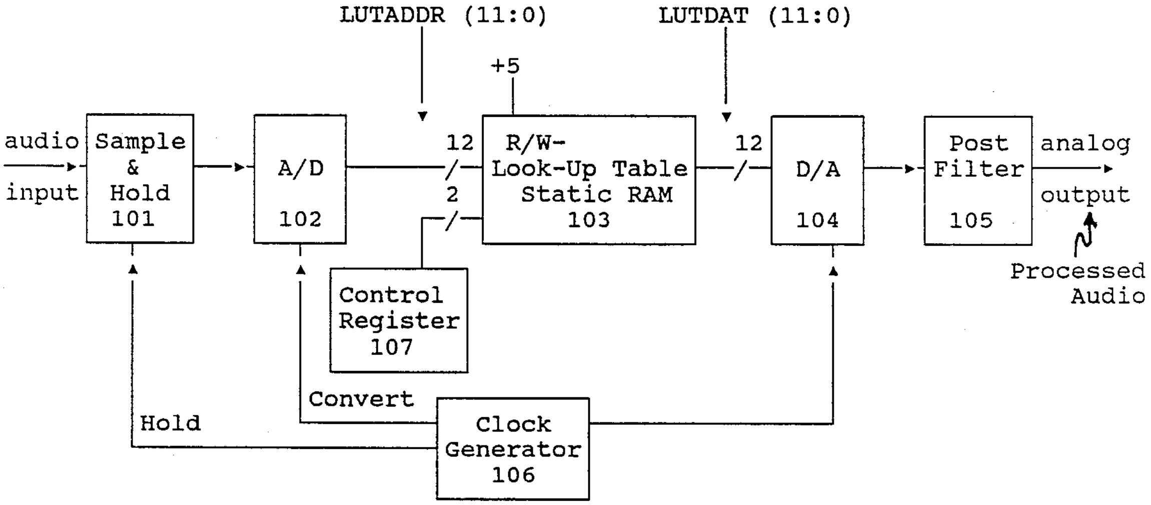
FIG. 2*a* is a block diagram of a preferred embodiment of the invention.

FIG. 2*a* represents a presently preferred practical realization of a processing module 12 in accordance with the present invention.

Figure 3A:
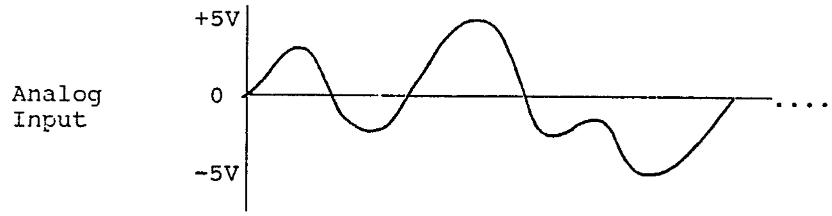
FIG. 3*a*–3*g* are timing diagrams useful in explaining the normal operational mode of the system shown in FIG. 2.
Figure 3B:
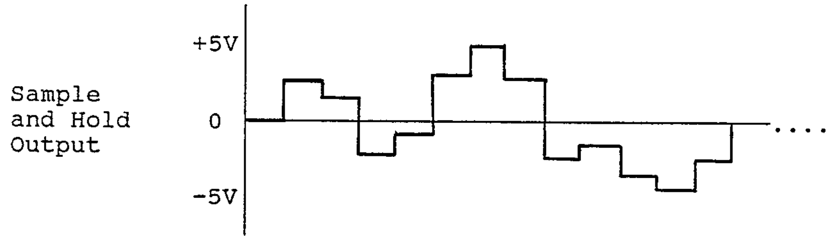
Figure 3C:

As shown in FIG. 2*a*, arbitrary analog audio signals are input to the module 12, where they are first processed by a sample-and-hold device 101. This processing is necessary in order to limit the distortion introduced by the successive approximation technique employed by an analog-to-digital converter (A/D) 102. The HOLD signal from the clock generator 106 causes the instantaneous existing voltage at the input to the Sample-and-hold device 101 to be held at a constant level throughout the duration of the HOLD pulse. When the HOLD signal returns to the low (SAMPLE) state, the output level is updated to reflect the instantaneous existing voltage at the input to the sample-and-hold device 101. (See FIGS. 3*a*, *b*, and *c*). In this embodiment, the clock generator 106 operates at 50 kHz repetition rate to provide sample pulses every 20 usec.

Concurrently with the HOLD pulse, a CONVERT pulse is sent by the clock generator 106 to an A/D convertor 102. This will cause the voltage held at the output of the sample and hold device 101 to be to be digitized, producing a 12-bit result, LUTADDR(11:0), (Look-up table address bits 11 through 0) at the output. This value ranges from 0 for the most negative input voltages, to 4095 for the most positive input voltages, with 2048 representing a 0 volt input. The value so produced will remain at the output until the next CONVERT pulse is received 20 usec later.

The 12-bit value from the A/D 102 is used to address an array of 4 8K by 8 static RAMs 103. The RAMs are organized in 2 banks of 2, each bank yielding 8K 16-bit words of storage. Since the total capacity of the array is 16K words while the address from the A/D 102 is only 12 bits (representing a 4K address space), there can exist four independent tables (2 banks of 2 tables each) in the array at any given time. The selection of one table from 4 is performed using a 2 bit control register 107 (Figure 2*a*). This control register 107 can either be modified directly by the user via switches, or under the host computer 123 control. The control register 107 provides address bits LUTADDR(13:12), which are concatenated with bits LUTADDR(11:0) from the A/D 102.

The static RAM's are always held in the READ state, since the Read/~Write inputs are always held high. Hence the locations addressed by the digitized audio are constantly output on the data lines I/0 (15:0).

Figure 3D:
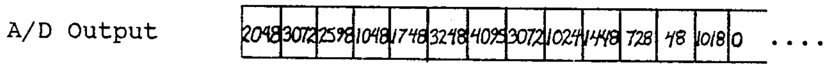
Figure 3E:
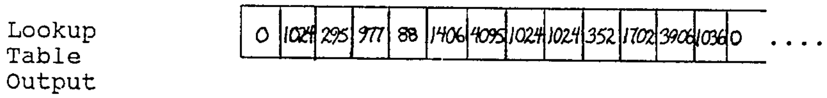

FIG. 3*d* illustrates a typical sequence of A/D values where the 2 control register bits are taken to be 00 for simplicity. The contents of the table represent a one-to-one mapping of input values (address) to output values (data stored at those addresses). For one arbitrary non-linear mapping function in RAM, the sequence of output values, LUTDAT(11:0), might be as shown in FIG. 3*e*. Note that there are 4 spare bits, since the array contains 16 bit words. Alternatively, a 16-bit D/A convertor can be substituted directly for the 12-bit version, affording greater precision of the output samples.

Figure 3F:
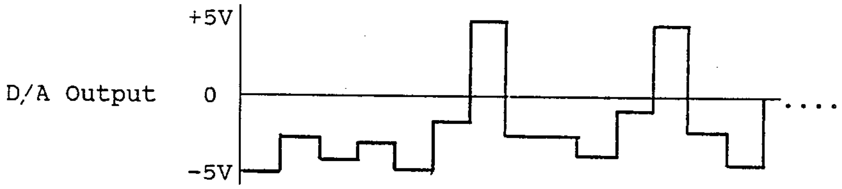

The 12-bit value output from the RAM array is input to a Digital to Analog convertor (D/A) 104. Input values are converted to voltages as depicted in FIG. 3*f*. Again, an input of 0 corresponds to the most negative voltage while a input of 4095 corresponds to the most positive.

Since the voltages from the D/A 104 occupy discrete levels and may contain D/A converter switching transients, it is necessary to perform some post-filtering in order to reduce any quantization or 'glitch' noise introduced. This is achieved using a seventh-order switched capacitor lowpass filter 105 (e.g. RF1509 manufactured by EG&G Reticon).

Figure 3G:
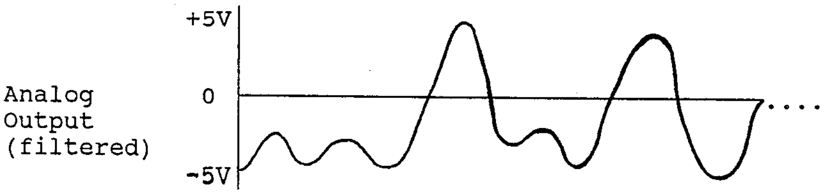

The smoothed output, as shown in FIG. 3*g*, can then be sent to the audio output of the device.

Chebyshev Polynomials

Given the architecture outlined above, the question arises as to what data should be used as the mapping function. Research into this question has been done by Arfib, Le Brun, Beauchamp in the area of mainframe synthesis using sinewave inputs. Throughout most of this work a particular class of polynomials, Chebyshev Polynomials, have been seen to exhibit interesting musical properties.

We shall denote this class of polynomials as $T_n(x)$, where $T_n$ is the nth order Chebyshev polynomial. These polynomials have the property that $$T_n(\cos(x))=\cos(nx). \quad (1)$$

In practical terms, if a sinewave of frequency 'X' Hz and unit amplitude is used as an argument to a function Tn(x), a sinewave of frequency n*X will result. A simple example can be derived from a trigonometric identity that states:

$$\cos(2x) = \cos^2(x) - \sin^2(x) \quad (2)$$

$$= 2\cos^2(x) - (\sin^2(x) + \cos^2(x)) \quad (3)$$

$$= 2\cos^2(x) - 1. \quad (4)$$

Therefore, $$T_2(x)=2x-1. \quad (5)$$

The recursive formula $$T_{n+1}2xT_n(x)-T_{n-1}(x) \quad (6)$$

can be used to find any of the Chebyshev polynomials given the order, n. By using a weighted sum of these polynomials, it is possible to transform a sinewave input into any arbitrary combination of that frequency and its harmonics.

When the input is not purely sinusoidal, but is rather an arbitrary audio waveform, the effect of the polynomial is more difficult to determine analytically, since the equations are inherently nonlinear. From a practical standpoint, higher order polynomials add progressively higher harmonics to the audio input.

Figure 2B:
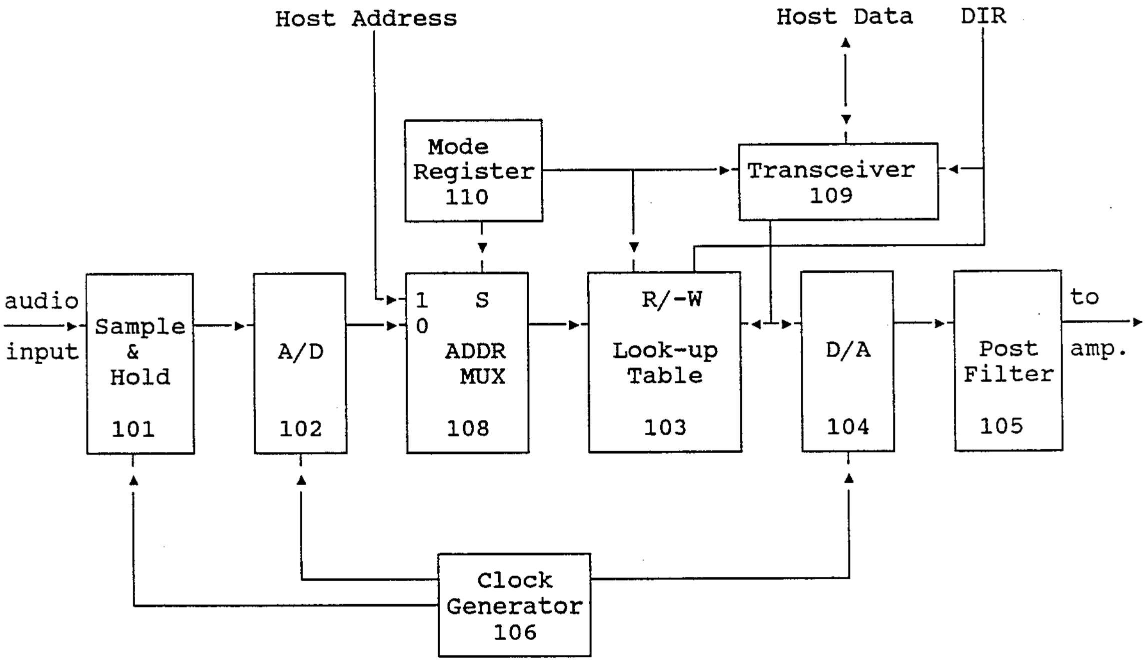
FIG. 2*b* shows the embodiment of FIG. 2*a* as interfaced to a host computer.
Figure 4:
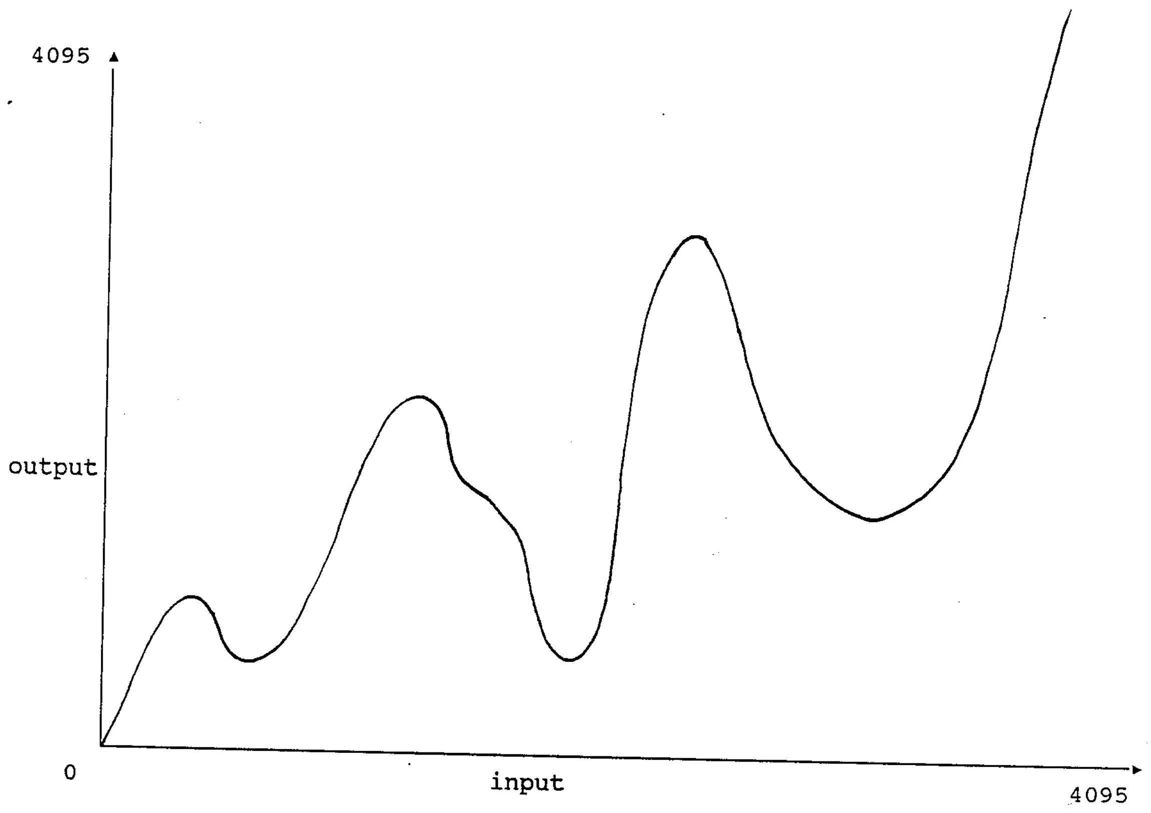
FIG. 4 is a graphical representation of a typical set of non-linear table values.

FIG. 4 illustrates a typical set of table values generated using a Chebyshev formula. Additional flexibility in determining table values may be obtained by using various building blocks, such as line segments either calculated or drawn free-hand with the graphic entry device 129 (FIG. 1) sinewave segments, splines, arbitrary polynomials and pseudo-random numbers and assembling these segments into the final table. Interpolation comprising 2nd or higher-order curve fitting techniques may be employed to smooth the resultant values. Host Computer Interface In order to experiment with various tables, an interface 117 to a host computer is desirable. This can be accomplished by mapping the LUT into the host computer's memory address using the circuit described in FIG. 2*b*. Here, a 12-bit 2-1 multiplexor 108 selects the address input to the RAM array from one of two buses, depending on the mode register 110. If this register is set (program mode), the address is taken from the host computer's address bus as opposed to the 12-bit output of the A/D convertor.

It is also necessary to provide a data interface to the host computer. This is accomplished by adding a bidirectional data buffer (Transceiver 109) and controlling the read/—write (R/—W) inputs to the RAMs. In program mode, the R/—W line is controlled by the bus R/—W command line. The data buffer is also controlled so that when a bus read takes place, data is driven from the RAMs to the host data bus. At all other times, data is driven from the host data bus to the RAM data inputs. Of course, when program mode is not enabled (register 112=0), the data buffer will be disabled and the R/—W input to the RAMs will be held high, as outlined in the original system.

Various peripheral devices can be added to the host computer to facilitate table editing operations. These include high-resolution graphics displays 130, and pointing devices such as a mouse or tablet (129-graphics entry device).

Alternate Embodiment

Figure 5:
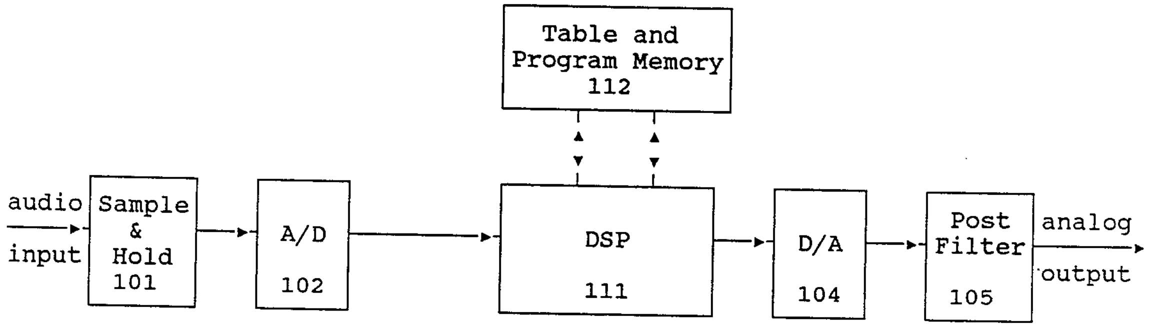
FIGS. 5 is a block diagram of an alternative embodiment showing the DSP chip replacing the dedicated RAM array.

FIG. 5 shows an alternative to the hardware based schemes outlined above which involves replacing the static RAM array with a general purpose Digital Signal Processor (DSP) chip such as the Texas Instruments TMS32020. In this scheme, the DSP (111) executes a simple program which causes it to read in successive values from the A/D convertor every time a new sample is available, via a hardware interrupt. The value read is used as an index into a lookup table stored somewhere in the processor's program memory (112). The value read from the indexed location is then sent to a D/A convertor which can be mapped into the processor's memory space. The same post-filtering scheme can be used to smooth the output before it is sent to a sound system.

This method has the advantage of increased flexibility, at the cost of having to provide a complete DSP system, including dedicated program memory and related interfaces. Modifications to the basic table lookup operation are achieved by making simple changes to the DSP program. This enables various interpolation and scaling schemes to be evaluated without the need for any hardware modifications. Of course, modifications to the table itself are also facilitated with this approach since table editing software can be run directly on the DSP.

Prescaling

Due to the inherently non-linear characteristics of the transformations employed, some form of prescaling of the input waveform may be desired in order to control what portions of the table are accessed throughout the evolution of the incoming signal. There are several methods of incorporating prescaling ranging from a simple linear transformation, to more complex nonlinear prescaling functions.

Figure 6A:
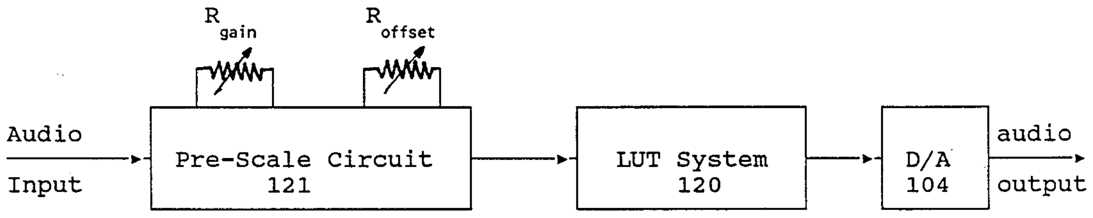
FIGS. 6*a*, *b* and *c* illustrate various systems that allow for amplitude pre-scaling.
Figure 6B:
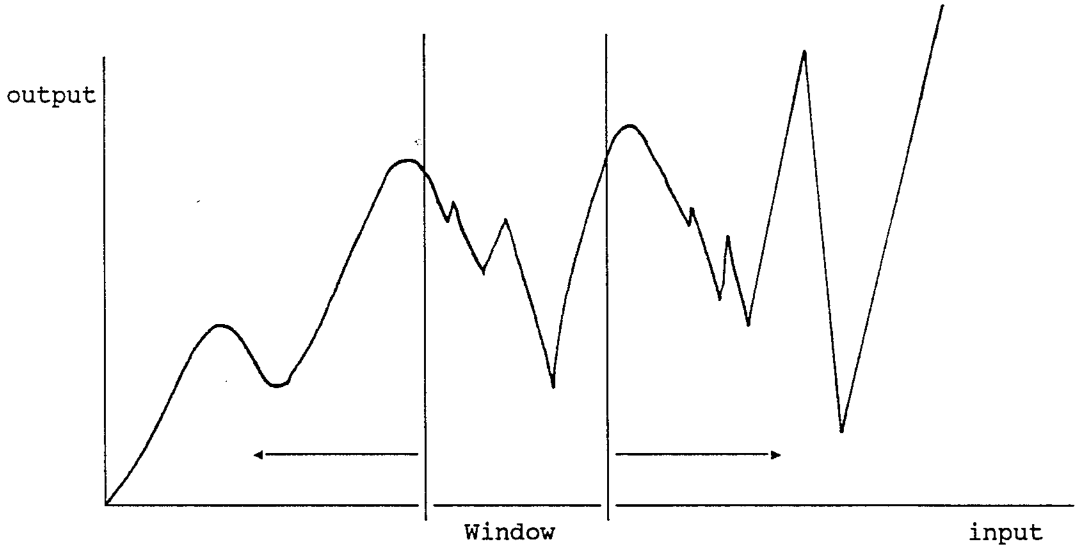

The simplest form of prescaling, illustrated in FIG. 6*a*, involves the addition of a linear prescaling circuit 121 prior to the A/D convertor. Using a pair of potentiometers $R_{gain}$ and $R_{offset}$ in an op-amp circuit, one can control both the gain and the offset of the incoming audio signal. At its simplest, the user can prevent clipping distortion by reducing the input gain. However, through careful adjustment of these two parameters, a variety of timbral transformations can be achieved using only one set of table values. For example, the gain can be reduced so that only a portion of the table is accessed by the input waveform. Then, the actual portion that is accessed can be changed continuously by adjusting the offset potentiometer. This can be viewed as a 'windowing' operation on the table, where a window of accessed table locations slides through the total range of values, as shown in FIG. 6*b*. In one application of this technique, the lower ranges are programmed to have a linear response, while higher regions produce more and more dramatic timbral changes. With this type of table, the offset potentiometer can be viewed as a distortion control. Clearly, other schemes and tables can be used to achieve a variety of control paradigms without departing from the scope of the invention.

Multiplication of the Output by a Carrier

Figure 7:
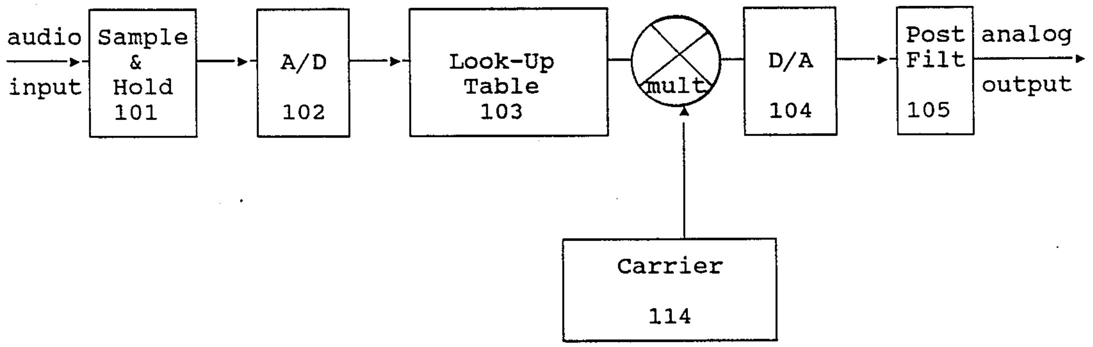
FIG. 7 illustrates the addition of a carrier multiplication to the output of the system.

FIG. 7 shows the multiplication of the output by a carrier (114) giving the result of timbral variation of the input signal dependent upon both its input amplitude and its frequency components. The additional partials resulting from this modulation at the output stage will change with the relative amplitudes of the modulator and the carrier, (modulation index) and the frequencies of the modulator and the carrier (ratio). Since the frequency components of the modulator are dependent upon the LUT employed as well as its input amplitude, a highly complex result is obtained.

Incorporation into Reverberation Architectures

Since the more expensive elements of the waveshaping system (i.e. D/A and A/D convertors) are already present in digital reverb systems, the added spectral modifications afforded by waveshaping can be included at a minimal increase in manufacturing cost. The incremental cost is essentially that of the lookup table RAM itself. ROM can be used in place of RAM where it is not necessary to allow table modification.

FIGS. 8*a*–*g* illustrate how the invention can be incorporated into a digital reverberation system. The signal from the A/D convertor passes through one or more digital delay elements (126) of varying delay times.

Figure 8A:
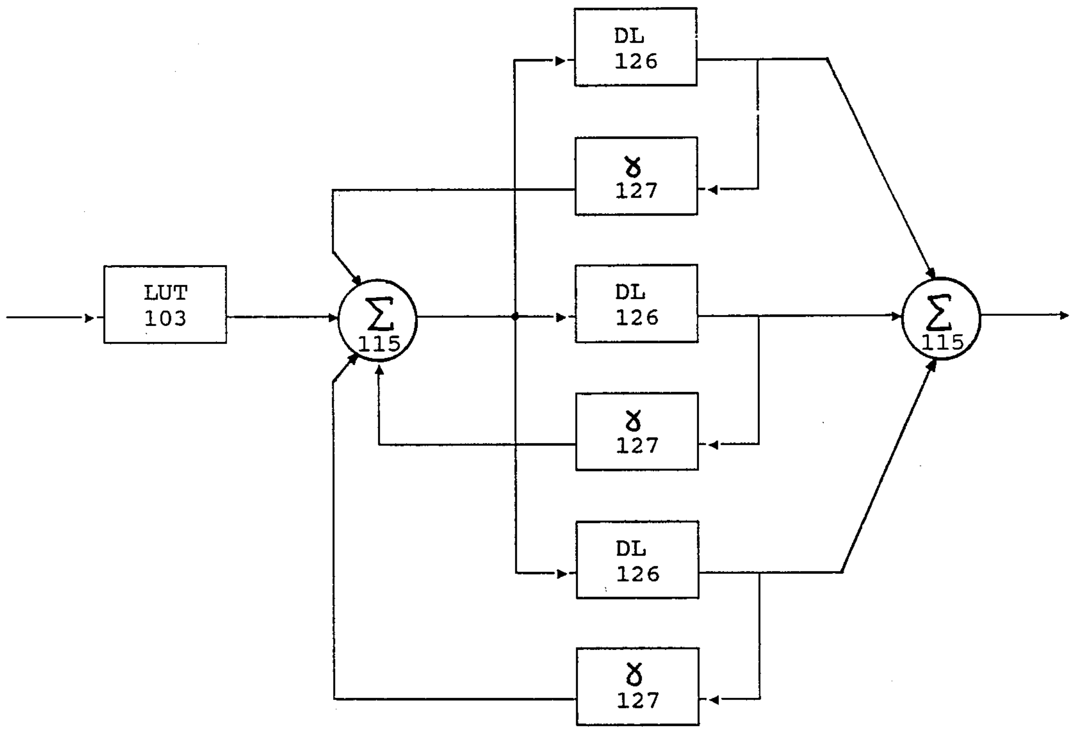
FIGS. 8*a*–*g* show how the invention may be integrated into a standard digital delay/reverberation/effects system.

In FIG. 8*a*, each of these delay elements is represented individually. It is understood that multiple elements may also be implied in FIGS. 8*b*–*g*. In such cases, multiple LUT elements may be required, depending on the specific arrangement. The multiple LUTs can be comprised of separate physical LUTs, or alternatively, one LUT being shared among the different paths, using a time-multiplexed technique.

Different placements of the LUT with respect to the reverb elements result in significant differences in the way the incoming signal is processed. If, for example, the LUT is placed before the reverb unit, as in FIG. 8*a*, the nonlinearly processed signal with all of the added spectral content enters the reverberation loop. This could lead to a very complex and/or bright overall reverberation effect, possibly introducing unwanted instabilities and oscillations. On the other hand, if the LUT is placed immediately after the reverb unit, as in FIG. 8*e*, the result would be a global (and variable) brightening of the reverb unit's sound.

Figure 8B:
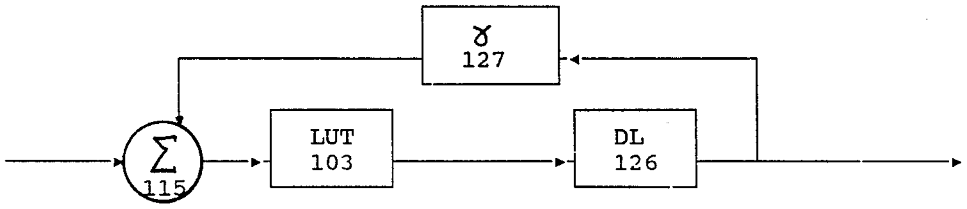
Figure 8C:
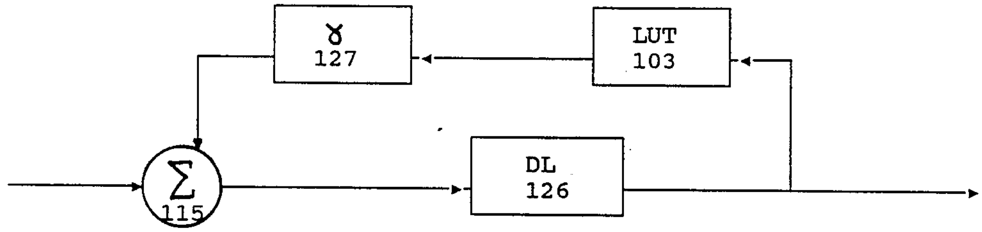
Figure 8D:
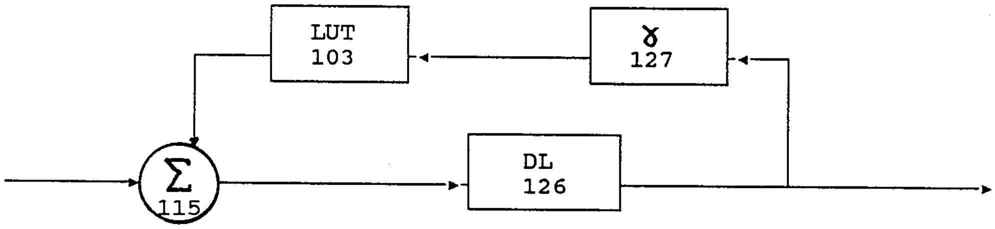
Figure 8E:
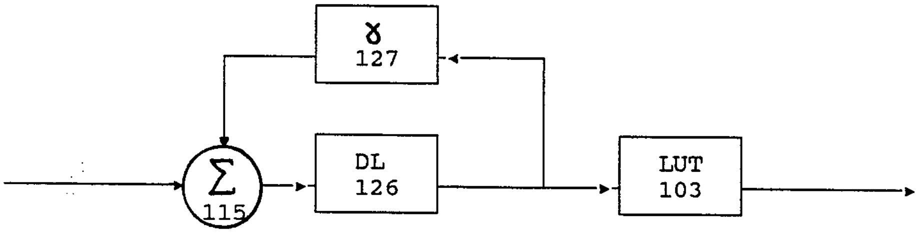
Figure 8F:
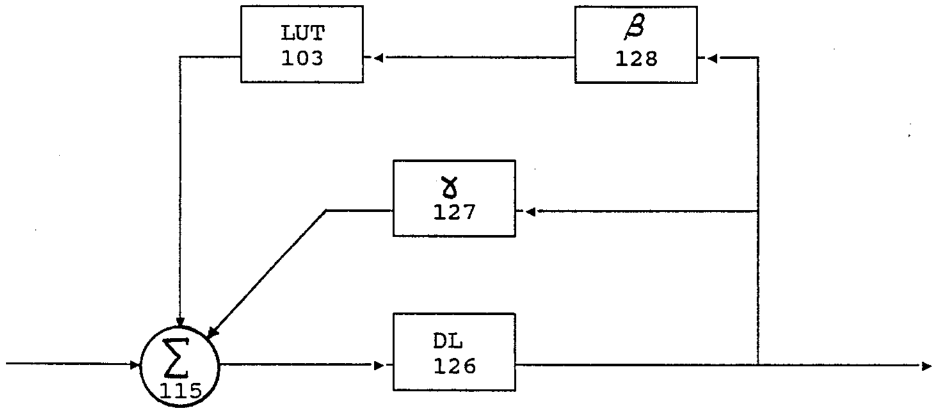
Figure 8G:
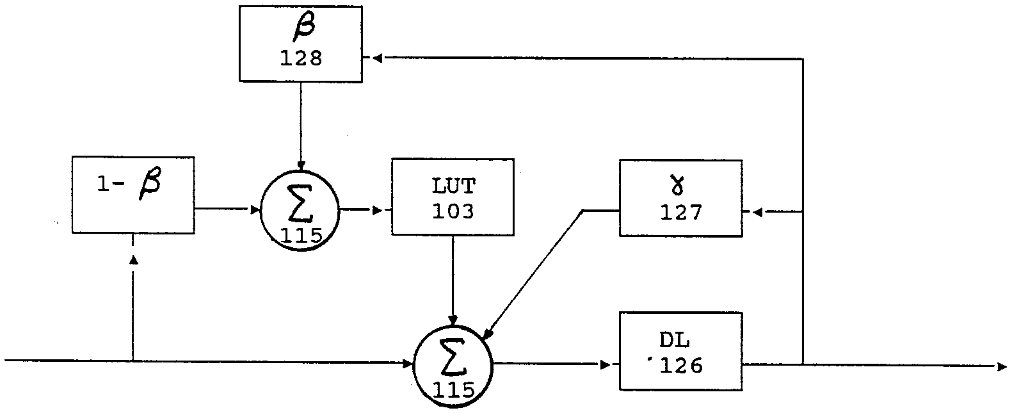

More interesting results are obtained when the LUT is placed somewhere within the architecture of the reverb unit itself as shown in FIGS. 8*b*, *c*, and *d*. In these cases, the feedback inherent in reverb systems adds considerable complexity to the effect of the waveshaper itself. Each pass through the reverb loop (or each echo, for long delay times) is subject to the nonlinear processing, with more and more high spectral components being added in each time. This can lead to some very unique results wherein a sound actually gets brighter and more complex as it fades away over the course of the reverberation.

Clearly, some very complex interactions are set up between the LUT(s) and various parameters of the reverberation, such as the delay gain elements (127). With multiple LUT configurations, varying amounts of spectral modification operate on each of the delayed components as the individual delay gain elements (127) are adjusted.

Multiple Look-up Tables with Crossfade Circuitry

Figure 9:
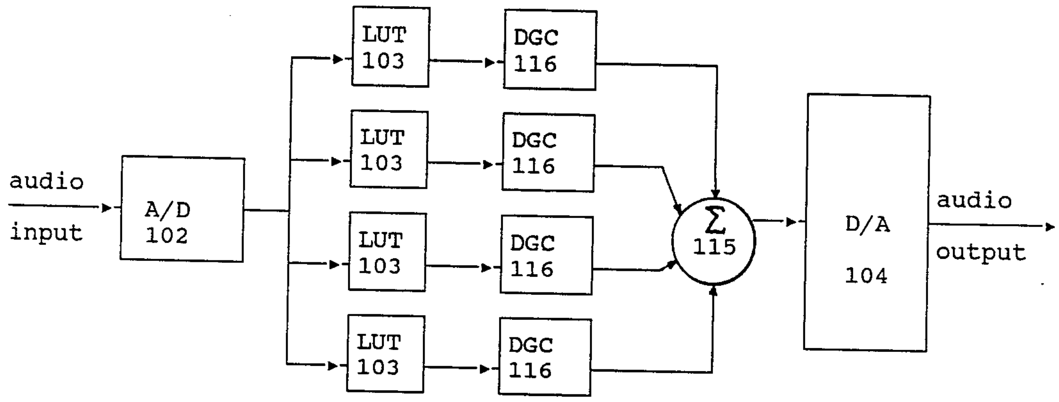
FIG. 9 shows the invention in a multiple Look-up table system with the capability of crossfading between tables.

FIG. 9 shows the use of a number of look-up tables in parallel along with the capability to crossfade between selected outputs. The arbitrary audio is input to the A/D converter (102) and sent from there to several LUT's (103) in parallel. The output of each LUT's is routed to an independent DGC (Digital Gain Control) device (116). The summed output is fed to the D/A converter (104). This configuration enables the blending of independently processed outputs for obtaining otherwise inaccessible timbres and continual timbral transitions not possible with a one LUT system. Additionally, a double buffering scheme could be devised in which one table is reloaded while not in use and is subsequently used while other tables are reloaded. In this way, the uninterrupted timbral transformations could continue indefinitely.

Real-Time FFT with Multiple Tables

Figure 10:
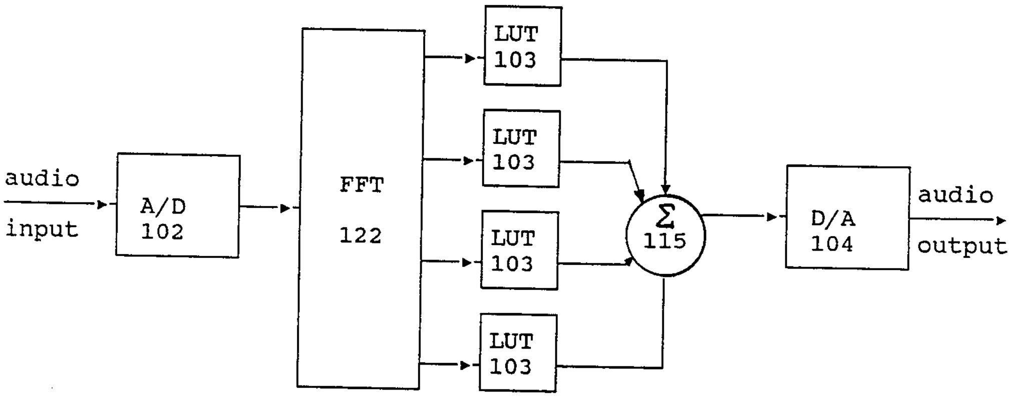
FIG. 10 shows the invention integrated into a Fast Fourier Transform system with individual tables on each FFT output.

In FIG. 10 the audio input is digitized and analyzed into its component sine waves by the Fast Fourier Transform technique (122). The resultant independent sine waves are fed to various LUT's for further processing. The output is mixed in an adder (115). This technique overcomes one of the problems inherent in the LUT technique wherein if the audio input contains multiple component frequencies, all of those frequencies are subject to the same LUT curve. The mixing that results is often undesirable musically, especially when non-harmonic partials are prominent in the input signal.

What is claimed is:

1. A digital audio signal processor comprising input means for receiving arbitrary analog audio input signals; input conversion means for converting said analog audio input signals into input digital signals which are representative of the instantaneous amplitudes of the audio input signal; non-linear transformation means for translating on a real time basis said input digital signals in accordance with a pre-determined translation map to produce the same output digital signal amplitude for a given input digital signal amplitude; and output conversion means for converting said output digital signal amplitude into analog form as an analog output signal, whereby said analog audio input signals are processed in real time, non-linearly modified by said non-linear transformation means, and outputted and reproduced in audible form.

2. A digital audio signal processor as defined in claim 1, wherein said non-linear transformation means comprises a look-up table (LUT).

3. A digital audio signal processor as defined in claim 1, wherein said non-linear transformation means comprises a digital signal processor (DSP).

4. A digital audio signal processor as defined in claim 1, further comprising timing means for generating timing signals for synchronized operation of the elements of the digital audio signal processor.

5. A digital audio signal processor as defined in claim 1, further comprising post filtering means for smoothing out the output from said output conversion means.

6. A digital audio signal processor as defined in claim 1, further comprising host computer means for generating host input addresses and host output data, and further comprising switching means for selecting an array input address from between said host computer and an incoming digital audio signal, the read/write status of an array, and a destination for the array, input/output data from between a host computer bus and output conversion circuitry.

7. A digital audio signal processor as defined in claim 1, further comprising a graphic entry means for generating values to be stored in said non-linear transformation means to create said translation map.

8. A digital audio signal processor as defined in claim 9, wherein said graphic entry means comprises a mouse.

9. A digital audio signal processor as defined in claim 7, wherein said graphic entry means comprises a pen.

10. A digital audio signal processor as defined in claim 7, wherein said graphic entry means comprises a joystick.

11. A digital audio signal processor as defined in claim 1, further comprising computer means for generating a translation map consisting of at least one of the following mapping elements: sinewave, line segments, splines, arbitrary polynominals, Chebyshev polynominals and pseudo-random numbers.

12. A digital audio signal processor as defined in claim 11, further comprising interpolation means for interpolating at least one of said mapping elements.

13. A digital audio signal processor as defined in claim 11, further comprising smoothing means for smoothing at least one of said mapping elements.

14. A digital audio signal processor as defined in claim 1, further comprising pre-scaling means for establishing portions of said translation map to be accessed by the incoming audio.

15. A digital audio signal processor as defined in claim 14, further comprising adjustment means for adjusting the degree of pre-scaling by said pre-scaling means.

16. A digital audio signal processor as defined in claim 1, further comprising modulating means for modulating a digital output from said non-linear transformation means by means of a carrier frequency.

17. A digital audio signal processor as defined in claim 1, further comprising reverberation means cooperating with said non-linear transformation means.

18. A digital audio signal processor as defined in claim 1, comprising a plurality of non-linear transformation means for processing said incoming audio signals in accordance with different translation maps; and summing means for adding the outputs of said nonlinear transformation means prior to processing by said output conversion means.

19. A digital audio signal processor as defined in claim 1, further comprising frequency separation means for separating said incoming audio into its constituted frequencies; and a plurality of non-linear transformation means each arranged to process one of a plurality of frequency carriers; and means for summing the output of the non-linear transformation means prior to processing by said output conversion means.

* * * * *